(12) United States Patent
Wang (10) Patent No.: US 12,041,718 B2
(45) Date of Patent: Jul. 16, 2024

(54) STRETCHABLE DISPLAY MODULE

(71) Applicant: Wuhan China Star Optoelectronics Semiconductor Display Technology Co., Ltd., Hubei (CN)

(72) Inventor: Wenqiang Wang, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/283,570

(22) PCT Filed: Jan. 28, 2021

(86) PCT No.: PCT/CN2021/074099
§ 371 (c)(1),
(2) Date: Apr. 8, 2021

(87) PCT Pub. No.: WO2022/151528
PCT Pub. Date: Jul. 21, 2022

(65) Prior Publication Data
US 2024/0023238 A1    Jan. 18, 2024

(30) Foreign Application Priority Data
Jan. 12, 2021 (CN) .......................... 202110035056.0

(51) Int. Cl.
*H05K 1/02* (2006.01)
(52) U.S. Cl.
CPC . *H05K 1/0283* (2013.01); *H05K 2201/10128* (2013.01)

(58) Field of Classification Search
CPC ........ H05K 1/0283; H05K 2201/10128; G06F 1/1652; G09F 9/301; G09F 9/335
See application file for complete search history.

(56) References Cited

U.S. PATENT DOCUMENTS

| | | | |
|---|---|---|---|
| 2014/0340857 A1* | 11/2014 | Hsu | H01L 23/5386 174/254 |
| 2015/0065840 A1* | 3/2015 | Bailey | H05K 1/0283 174/251 |
| 2015/0380355 A1* | 12/2015 | Rogers | H01L 23/5387 257/773 |

(Continued)

FOREIGN PATENT DOCUMENTS

| | | |
|---|---|---|
| CN | 107026245 | 8/2017 |
| CN | 107731866 | 2/2018 |

(Continued)

*Primary Examiner* — Nathan Milakovich (57) ABSTRACT

A stretchable display module is disclosed. The stretchable display module includes a plurality of islands and a plurality of bridges. Each of the bridges includes a first connection part, a second connection part, and a plurality of bending parts, the first connection part is connected to a first side of one of the islands, and the second connection part is connected to a second side of another adjacent island. The first side includes a first endpoint and a second endpoint, and the second side includes a third endpoint on a same side as the first endpoint and a fourth endpoint on a same side as the second endpoint. The bending parts do not protrude from a connecting line between the first endpoint and the third endpoint.

19 Claims, 9 Drawing Sheets

(56) References Cited

U.S. PATENT DOCUMENTS

| | | | |
|---|---|---|---|
| 2018/0046221 A1* | 2/2018 | Choi | H05B 33/22 |
| 2020/0020273 A1* | 1/2020 | Hong | G09G 3/32 |
| 2021/0013433 A1* | 1/2021 | Zhai | B32B 3/263 |
| 2021/0098555 A1* | 4/2021 | Kim | H10K 59/121 |
| 2022/0039248 A1* | 2/2022 | Sano | H05K 1/189 |
| 2023/0016636 A1* | 1/2023 | Wang | G09G 3/035 |
| 2023/0117283 A1* | 4/2023 | Wang | H10K 59/131 |
| | | | 361/679.27 |

FOREIGN PATENT DOCUMENTS

| | | |
|---|---|---|
| CN | 108389884 | 8/2018 |
| CN | 110718555 | 1/2020 |
| CN | 111210726 | 5/2020 |
| CN | 111276528 | 6/2020 |
| CN | 111833753 | 10/2020 |

* cited by examiner

STRETCHABLE DISPLAY MODULE

RELATED APPLICATIONS

This application is a National Phase of PCT Patent Application No. PCT/CN2021/074099 having International filing date of Jan. 28, 2021, which claims the benefit of priority of Chinese Patent Application No. 202110035056.0 filed on Jan. 12, 2021. The contents of the above applications are all incorporated by reference as if fully set forth herein in their entirety.

FIELD AND BACKGROUND OF THE INVENTION

The present disclosure relates to the field of flexible display technologies, and more particularly, to a stretchable display module.

In recent years, update and iteration speeds of flexible display technologies are accelerated, and foldable and rollable display screens have been relatively matured. Related manufacturers continue to introduce new terminal display products, and flexible displays achieved by stretching screens toward any direction based on an original area have become a development direction of the flexible display technologies. Flexible displays are applied to medical equipment, vehicle displays, wearable displays, and other display fields, which require display modules to be adapted to a structural form having complex and changeable curved surfaces, so screens are demanded to have excellent stretchability and better shaping designs. That is, the screens may display normally after the display modules are stretched by an external force at a certain length, and can effectively display according to surface forms of structures that the screens are attached to or assembled with, thereby obtaining excellent three-dimensional display effect and visual experiences.

However, due to uneven forces during stretching, structures of current flexible display modules will lead to local stress concentration and cause stretchable units to break.

Technical problem: an embodiment of the present disclosure provides a stretchable display module to solve a problem of breakage of the stretchable units caused by the local stress concentration of the current flexible display modules due to uneven forces during stretching.

SUMMARY OF THE INVENTION

An embodiment of the present disclosure provides a stretchable display module, which includes a plurality of islands and a plurality of bridges. Each of the islands is provided with at least one pixel unit. Each of the bridges connects two adjacent islands and is provided with a plurality of wirings, and each of the bridges includes a first connection part, a second connection part, and a plurality of bending parts disposed between the first connection part and the second connection part and connected to each other in sequence, the first connection part is connected to a first side of one of the islands, and the second connection part is connected to a second side of another one of the adjacent islands. The first side includes a first endpoint and a second endpoint, and the second side includes a third endpoint on a same side as the first endpoint and a fourth endpoint on a same side as the second endpoint, wherein, a distance between the first endpoint and the first connection part is less than a distance between the second endpoint and the first connection part, and a distance between the third endpoint and the second connection part is less than a distance between the fourth endpoint and the second connection part. Wherein, the bending parts do not protrude from a connecting line between the first endpoint and the third endpoint.

In at least one embodiment of the present disclosure, each of the bridges has a first bending direction and a second bending direction with different bending directions to each other, a plurality of the bending parts having the first bending direction do not protrude from the connecting line between the first endpoint and the third endpoint, and a plurality of the bending parts having the second bending direction protrude from a connecting line between the second endpoint and the fourth endpoint.

In at least one embodiment of the present disclosure, each of the bridges further includes a first bending part, a second bending part, and a third bending part. Wherein, the first bending part is connected to the first connection part, the second bending part is connected to the first bending part, and the third bending part is connected to the second bending part and the second connection part.

In at least one embodiment of the present disclosure, the second bending part does not protrude from the connecting line between the first endpoint and the third endpoint, and the first bending part and the third bending part protrude from the connecting line between the second endpoint and the fourth endpoint.

In at least one embodiment of the present disclosure, an outer edge of the second bending part is positioned in an area formed between the connecting line between the first endpoint and the third endpoint and a connecting line between a midpoint of the first side and a midpoint of the second side.

In at least one embodiment of the present disclosure, each of the bridges is an axisymmetric structure, and a symmetry axis of each of the bridges coincides with a symmetry axis of the two adjacent islands connected to each of the bridges.

In at least one embodiment of the present disclosure, each of the bridges further includes a plurality of straight parts, and each of the straight parts connects two adjacent bending parts to each other or connects one bending part to one connection part adjacent to each other.

In at least one embodiment of the present disclosure, each of the bridges includes a first straight part connecting the first connection part to the first bending part and a second straight part connecting the first bending part to the second bending part, and a length of the first straight part is same as a length of the second straight part.

In at least one embodiment of the present disclosure, the first straight part is parallel to the second straight part.

In at least one embodiment of the present disclosure, a width of the first straight part is same as a width of the second straight part.

In at least one embodiment of the present disclosure, a radius of curvature of the first bending part is same as a radius of curvature of the second bending part.

In at least one embodiment of the present disclosure, the first connection part and the second connection part both include another bending part.

In at least one embodiment of the present disclosure, a radius of curvature of the bending part of the first connection part is different from a radius of curvature of the first bending part.

In at least one embodiment of the present disclosure, a center of the bending part of the first connection part, a center of the second bending part, and a center of the bending part of the second connection part are on a same straight line.

In at least one embodiment of the present disclosure, each of the islands includes a plurality of sides, each of the sides is correspondingly connected to one of the bridges, and a plurality of the bridges connected to a same island has a centrosymmetric structure that is symmetrical about a center of the island.

In at least one embodiment of the present disclosure, each of the bridges includes a wiring placement area having a same extending direction as the bridges, and the wirings are disposed in the wiring placement area.

In at least one embodiment of the present disclosure, a ratio of a width of the wiring placement area to a width of a main body of the bridges ranges from ½ to ¾.

In at least one embodiment of the present disclosure, the stretchable display module includes a flexible substrate, the plurality of islands, the plurality of bridges, and a plurality of hollowed-out parts.

In at least one embodiment of the present disclosure, the stretchable display module further includes a plurality of inorganic layers and organic layers stacked on the flexible substrate, and the hollowed-out parts penetrate through the inorganic layers, the organic layers, and the flexible substrate.

In at least one embodiment of the present disclosure, each of the islands is provided with one pixel unit, and the pixel unit includes three sub-pixels having different colors.

Beneficial effect: the stretchable display module having island-bridge structures provided by the present disclosure, when stretching by an external force, can ensure each island to deform simultaneously during stretching and to undergo uniform forces, and ensure each bridge to undergo relatively balanced forces everywhere during stretching, thereby relieving and dispersing stresses and preventing local stress concentration. Therefore, breakage of stretchable units can be prevented, and high-resolution display having a pixel density not less than 70.5 PPI can be realized.

BRIEF DESCRIPTION OF THE SEVERAL VIEWS OF THE DRAWINGS

The accompanying figures to be used in the description of embodiments of the present disclosure will be described in brief to illustrate the technical solutions of the embodiments more clearly. The accompanying figures described below are only part of the embodiments of the present disclosure, from which those skilled in the art can derive further figures without making any inventive efforts.

DESCRIPTION OF SPECIFIC EMBODIMENTS OF THE INVENTION

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure. The specific embodiments described with reference to the attached drawings are all exemplary and are intended to illustrate and interpret the present disclosure. In the description of the present disclosure, it should be understood that terms such as "upper", "lower", "front", "rear", "left", "right", "inside", "outside", "side", as well as derivative thereof should be construed to refer to the orientation as described or as shown in the drawings under discussion. Therefore, the directional terms used are to illustrate and understand the present disclosure, not to limit the present disclosure. The identical or similar reference numerals constantly denote the identical or similar elements or elements having the identical or similar functions in the drawings.

An embodiment of the present disclosure provides a stretchable display module. It will be described in detail in the following. It should be noted that an order of description in the following embodiments is not meant to limit a preferred order of the embodiments.

Figure 1:
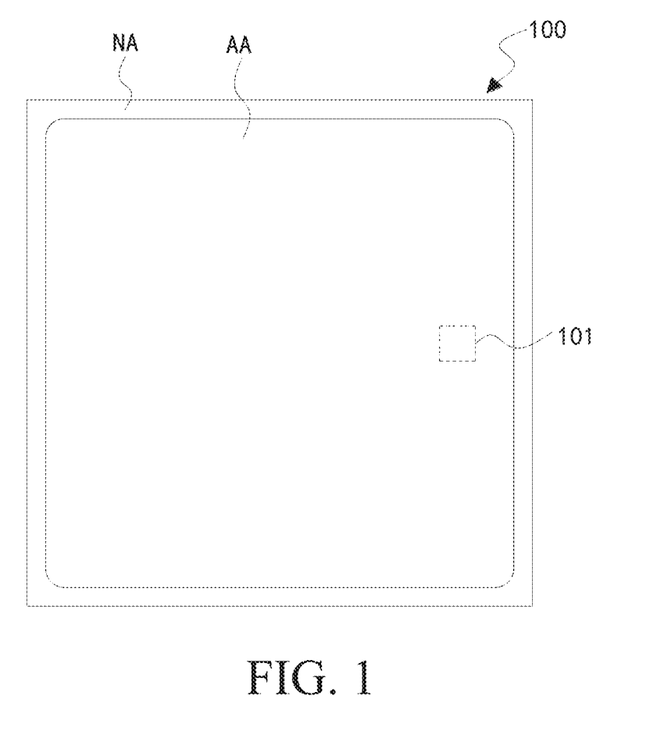
FIG. 1 is a schematic structural diagram of a stretchable display module according to an embodiment of the present disclosure.

Referring to FIG. 1, the stretchable display module 100 provided by the embodiment of the present disclosure includes a display area AA and a non-display area (NA) disposed surrounding the display area AA, and the display area AA is provided with a plurality of stretchable units.

Figure 2:
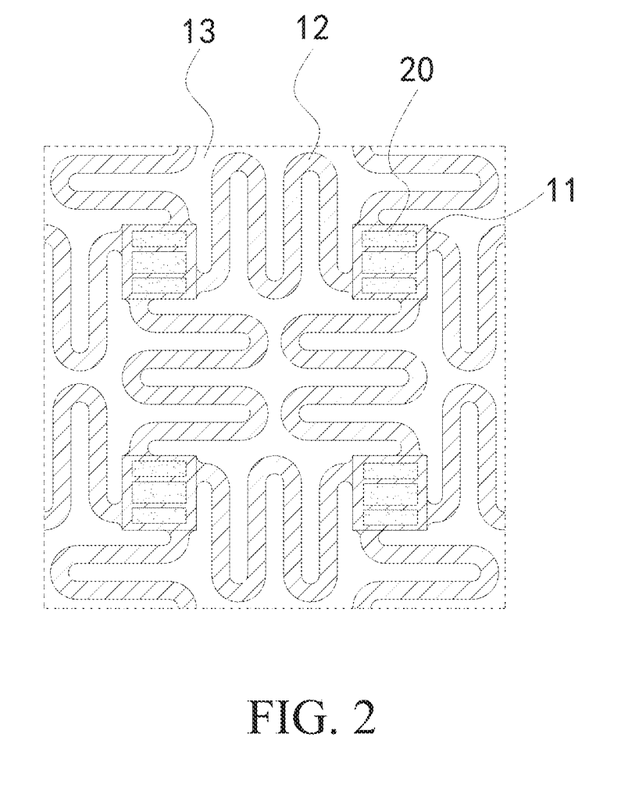
FIG. 2 is a schematic enlarged diagram of a site 101 in the stretchable display module of FIG. 1 according to an embodiment of the present disclosure.

Referring to FIG. 2, FIG. 2 is a schematic enlarged diagram of a site 101 in the stretchable display module 100 of FIG. 1. The stretchable display module 100 includes a plurality of islands 11 distributed in an array and a plurality of bridges 12. Each of the bridges 12 connects two of the islands 11 adjacent to each other, and each of the islands 11 is provided with at least one pixel unit 20.

Figure 3:
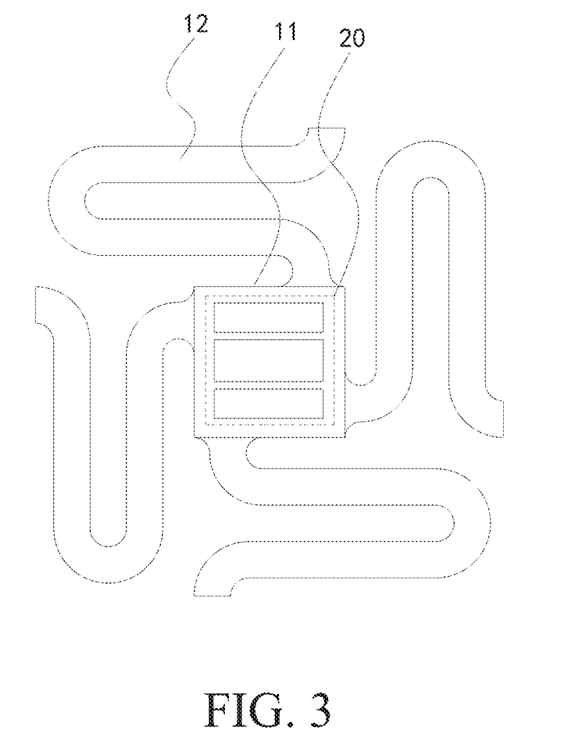
FIG. 3 is a schematic structural diagram of a connection between an island and a bridge according to an embodiment of the present disclosure.
Figure 4:
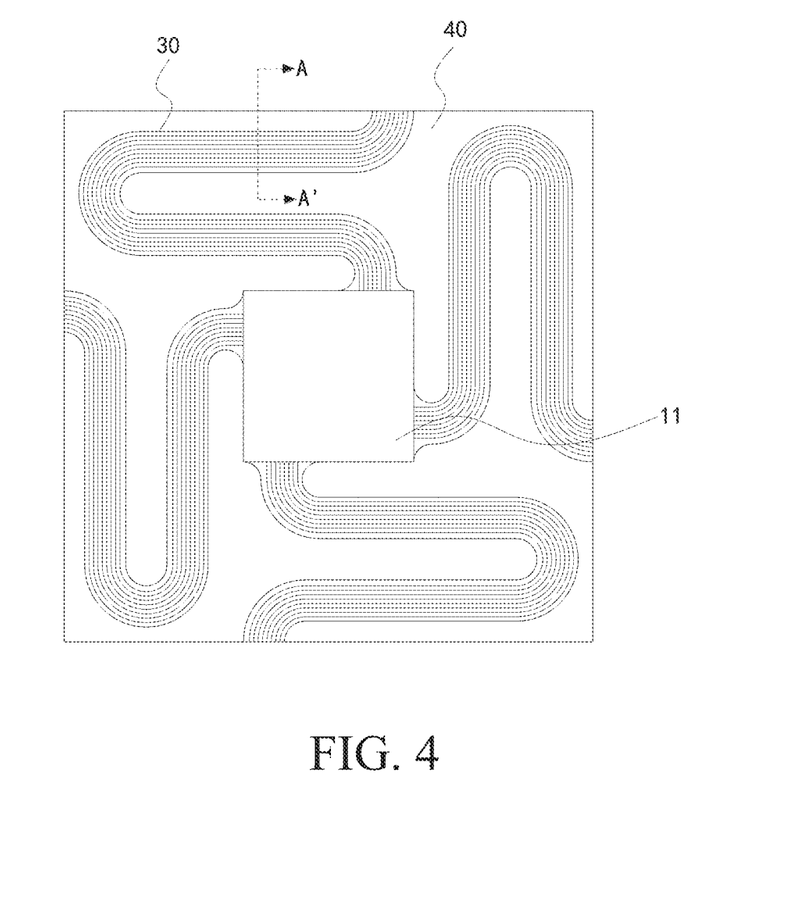
FIG. 4 is a schematic structural diagram of a plurality of wirings on the bridge according to an embodiment of the present disclosure.

Referring to FIGS. 3 and 4, each of the bridges 12 is provided with a plurality of wirings 30, and the wirings are configured to realize electrical connections among adjacent pixel units 20, thereby realizing connections and integration of drive voltage signals, gate signals, and data transmission signals, thereby realizing light emission of the pixel units 20. Specifically, the wirings 30 may be scanning lines, data lines, common lines, or other signal lines.

In an embodiment, referring to FIG. 2, the stretchable display module 100 includes a flexible substrate, the plurality of islands 11 arranged in the array and disposed on the flexible substrate, the plurality of bridges 12, and a plurality of hollowed-out parts 13 that hollow the flexible substrate. The hollowed-out parts 13 may be filled with an optically clear adhesive (OCA) layer 40 to improve flatness of the flexible substrate. An OCA glue has good elasticity, certain fluidity, and better fillability, so it can be restored to its original state after being subjected to a large tensile strain, thereby effectively ensuring flatness of screens both before and after stretching.

Each of the bridges 12 in this embodiment is a bending bridge, and the wirings disposed on the bending bridge are bending wirings. The stretchable units are composed of bending bridges and the islands, so stretchable display can be achieved by a large cumulative deformation obtained by small local deformations of each bending bridge. The bending bridges can allow the wirings connecting the adjacent pixel units 20 to have a longer wiring length, which can effectively relieve stresses during stretching by an external force and can prevent the wirings from having a large deformation to cause a sudden change in resistances, unstable changes in optical display brightness, and nonuniform display brightness during stretching.

Referring to FIG. 3, in an embodiment of the present disclosure, each of the islands 11 includes a plurality of sides, each of the sides is correspondingly connected to one of the bridges 12, and a plurality of the bridges 12 connected to a same island 11 has a centrosymmetric structure that is symmetrical about a center of the island 11, thereby ensuring the islands to receive uniform forces when stretched and to deform simultaneously. The islands store elasticity after stretched simultaneously, and when the external force is unloaded, the display module 100 is easier to restore to the original state, thereby realizing repeatable stretching performance.

In this embodiment, the islands 11 are square, and four sides of each of the islands 11 are correspondingly connected to one of the bridges 12, respectively. In other embodiments, the islands may be one of rectangular, rhombic, trapezoidal, circular, oval, or other polygonal, but are not limited to this.

In this embodiment, each island 11 is provided with one pixel unit 20, and each pixel unit 20 includes three sub-pixels having different colors, which may be a red sub-pixel, a green sub-pixel, and a blue sub-pixel. Areas of different sub-pixels may be designed according to actual needs. For example, since the blue sub-pixel has a lower light-emitting rate, an area of the blue sub-pixel may be designed to be greater than areas of the other two sub-pixels. In other embodiments, each pixel unit 20 may also include a white sub-pixel.

Further, in this embodiment, the display area AA may be square, numbers of pixel units 20 distributed in lateral and longitudinal directions inside the display area AA are same, and spacings between each of the islands 11 are same. In other embodiments, the display area AA may be rectangular, circular, or other special-shaped structures.

Figure 5:
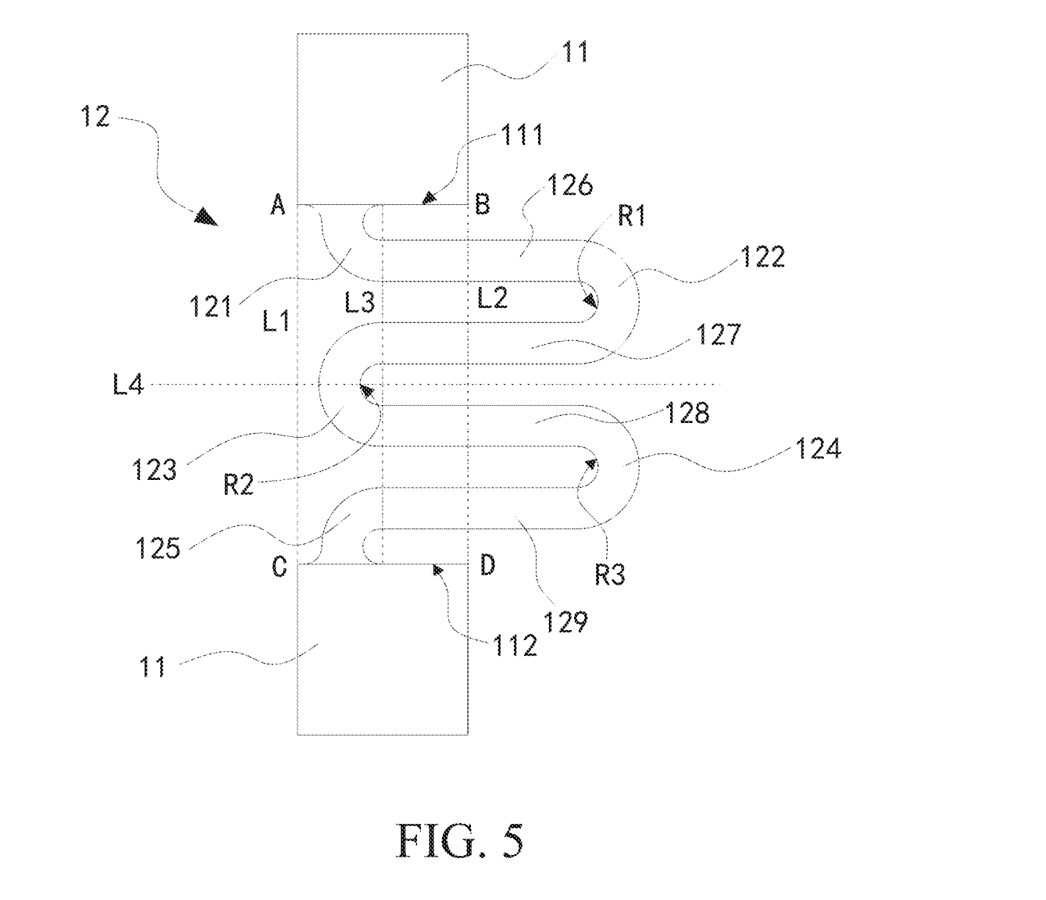
FIG. 5 is a schematic structural diagram of the bridge connecting adjacent islands to each other according to an embodiment of the present disclosure.

Referring to FIG. 5, specifically, each of the bridges 12 includes a first connection part 121, a second connection part 125, and a plurality of bending parts (such as 122, 123, and 124) disposed between the first connection part 121 and the second connection part 125 and connected to each other in sequence. The first connection part 121 is connected to a first side 111 of one of the islands 11, and the second connection part 125 is connected to a second side 112 of another island 11 adjacent thereto.

When the display area AA as a whole is stretched, the bending parts of the bridges 12 among each of the islands 11 simultaneously undergo forces and deform. Since the bridges 12 are distributed around each of the islands 11, when the display module 100 is subjected to an external force, it is easier to simultaneously deform toward every direction, and positions for maximum deformation are mainly located in the bending parts rather than the islands 11 where the pixel units 20 are located. Therefore, display device layers of the pixel units 20 can be prevented from breaking and losing effectiveness due to external stretching forces.

Specifically, the first side 111 includes a first endpoint A and a second endpoint B, and the second side 112 includes a third endpoint C on a same side as the first endpoint A and a fourth endpoint D on a same side as the second endpoint B. Wherein, a distance between the first endpoint A and the first connection part 121 is less than a distance between the second endpoint B and the first connection part 121, and a distance between the third endpoint C and the second connection part 125 is less than a distance between the fourth endpoint D and the second connection part 125. That is, compared to the second endpoint B, the first connection part 121 is closer to the first endpoint A, and compared to the fourth endpoint D, the second connection part 125 is closer to the third endpoint C.

Wherein, the bending parts do not protrude from a connecting line L1 between the first endpoint A and the third endpoint C. That is, the bending parts (such as 122, 123, and 124) do not intersect the connecting line L1 or at most intersect the connecting line L1 to have only one intersection, so that partial lengths of the bending parts can be designed to be roughly the same, which is beneficial to each of the bending parts to undergo uniform forces.

Continuing to refer to FIG. 5, each of the bridges 12 has a first bending direction and a second bending direction with different bending directions to each other. A plurality of the bending parts having the first bending direction do not protrude from the connecting line L1 between the first endpoint A and the third endpoint C, and a plurality of the bending parts having the second bending direction protrude from a connecting line L2 between the second endpoint B and the fourth endpoint D, thereby allowing each of the bridges 12 that connects adjacent islands 11 to have a certain length, thereby improving stretching performance.

A difference between the first bending direction and the second bending direction can be understood that their curved arcs facing different directions. Taking a bridge connecting two islands in a vertical direction in FIG. as an example, the first bending direction in FIG. 5 is toward right, and the second bending direction is toward left. It can be understood that the first bending direction of a bridge connecting two islands arranged in a horizontal direction is upward (downward), and the second bending direction thereof is downward (upward).

In this embodiment, each bridge 12 including three bending parts is taken as an example for description, but it is not limited to this. Specifically, referring to FIG. 5, each of the bridges 12 includes a first bending part 122, a second bending part 123, and a third bending part 124. The first bending part 122 is connected to the first connection part 121, the second bending part 123 is connected to the first bending part 122, and the third bending part 124 is connected to the second bending part 123 and the second connection part 125.

Referring to FIG. 5, in this embodiment, the second bending part 123 does not protrude from the connecting line L1 between the first endpoint A and the third endpoint C, and the first bending part 122 and the third bending part 124 protrude from the connecting line L2 between the second endpoint B and the fourth endpoint D. When compared to the bending parts in a left side protruding from the connecting line L1 and the bending parts in a right side protruding from the connecting line L2, in this embodiment, the bending parts in the left side not protruding from the connecting line L1 can allow part of each bending part to have a similar length, and stresses undergone by each bending part are roughly same when stretching, thereby preventing local stress concentration.

Further, an outer edge of the second bending part 123 may be positioned in an area formed between the connecting line L1 between the first endpoint A and the third endpoint C and a connecting line L3 between a midpoint of the first side 111 and a midpoint of the second side 112.

In an embodiment of the present disclosure, each of the bridges 12 is an axisymmetric structure, and a symmetry axis L4 of each of the bridges 12 coincides with a symmetry axis of two adjacent islands 11 connected to each of the bridges 12. Therefore, when an island-bridge structure is stretched, each bending part of each bridge undergoes a relatively balanced pulling force.

Each of the bridges 12 further includes a plurality of straight parts, and each of the straight parts connects two adjacent bending parts to each other (such as connecting the first bending part 122 and the second bending part 123 or connecting the second bending part 123 and the third bending part 124) or connects one bending part to one connection part adjacent to each other (such as connecting the first connection part 121 and the first bending part 122 or connecting the third bending part 124 and the second connection part 125).

Referring to FIG. 5, this embodiment includes a first straight part 126, a second straight part 127, a third straight part 128, and a fourth straight part 129. The first straight part 126 connects the first connection part 121 and the first bending part 122, the second straight part 127 connects the first bending part 122 and the second bending part 123, the third straight part 128 connects the second bending part 123 and the third bending part 124, and the fourth straight part 129 connects the third bending part 124 and the second connection part 125.

Wherein, a length of the first straight part 126 is same as a length of the second straight part 127. Since each bridge 12 is symmetrical about the axis L4, when the length of the first straight part 126 is the same as the length of the second straight part 127, lengths of other straight parts are same and equal to the length of the first straight part 126.

The island-bridge structure can undergo relatively balanced forces everywhere during stretching by disposing the bridges 12 as a symmetrical structure and designing sizes of each straight part of the bridges 12 to be consistent, thereby facilitating to disperse stresses and preventing the local stress concentration.

Further, the first straight part 126 is disposed parallel to the second straight part 127, which can reduce a vertical spacing between the bending parts and can arrange more bending parts in a finite space.

Further, a width of the first straight part 126 is same as a width of the second straight part 127.

In an embodiment, radii of curvature of the bending parts between the first connection part 121 and the second connection part 125 may be same.

Specifically, in this embodiment, the radius of curvature R1 of the first bending part 122, the radius of curvature R2 of the second bending part, and the radius of curvature R3 of the third bending part may be equal to each other, thereby allowing each bending part to undergo relatively balanced forces. The radii of curvature of the bending parts mentioned in this embodiment all refer to a radius of curvature of an inner arc.

In an embodiment of the present disclosure, the first connection part 121 and the second connection part 125 may also include another bending part.

Figure 6:
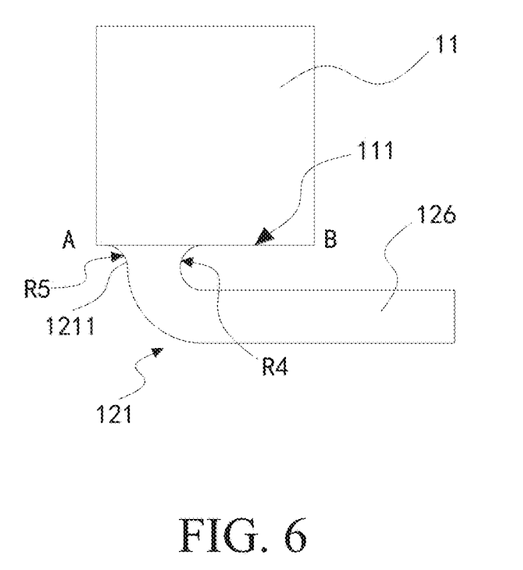
FIG. 6 is a schematic structural diagram of a first connection part according to an embodiment of the present disclosure.

Since each bridge 12 in this embodiment is symmetrical about the axis L4, a structure of the first connection part 121 is same as a structure of the second connection part 125. Referring to FIG. 6, the first connection part 121 is taken as an example for description.

In this embodiment, a bending topography of the first connection part 121 is different from a bending topography of the first bending part 122. In other embodiment, the bending topography of the first connection part 121 may be same as the bending topography of the first bending part 122. The bending topography mentioned in this embodiment includes a bending radius and a bending shape.

Specifically, a radius of curvature R4 of the bending part of the first connection part 121 is different from the radius of curvature R1 of the first bending part 122. One side of the first connection part 121 adjacent to the first endpoint A is provided with an external chamfer 1211, and an arc of the external chamfer 1211 is toward an opposite direction from an inner arc of the first connection part 121. A width of part of the first connection part 121 adjacent to the first side 111 can be increased by disposing the external chamfer 1211, thereby improving a connecting strength between the first connection part 121 and the first side 111.

In an embodiment, a radius of curvature R5 of the external chamfer 1211 may be same as the radius of curvature R4 of the bending part of the first connection part 121.

In an embodiment of the present disclosure, a center of the bending part of the first connection part 121 (a center corresponding to the radius of curvature R4), a center of the second bending part 123 (a center corresponding to R2), and a center of the bending part of the second connection part 125 which is symmetrical to the first connection part 121 are on a same straight line.

In this embodiment, inner arcs of the bending part of the first connection part 121, the first bending part 122, and the second bending part 123 are all semicircles. In other embodiment, the inner arc of the first connection part 121 is less than a semicircle, and the inner arcs of the first bending part 122 and the second bending part 123 are semicircles.

In other embodiment, the inner arc of the first bending part 122 may be composed of two or more arcs corresponding to different radii of curvature, and it is not limited herein.

In the above embodiments, a pixel density of the stretchable display module may be designed to be not less than 70.5 PPI, and an overall stretching rate may not be less than 5%. In this embodiment of the present disclosure, a side length of each island 11 is not greater than 116 μm, and a spacing between two adjacent islands 11 may be designed to be 244 μm.

Figure 7:
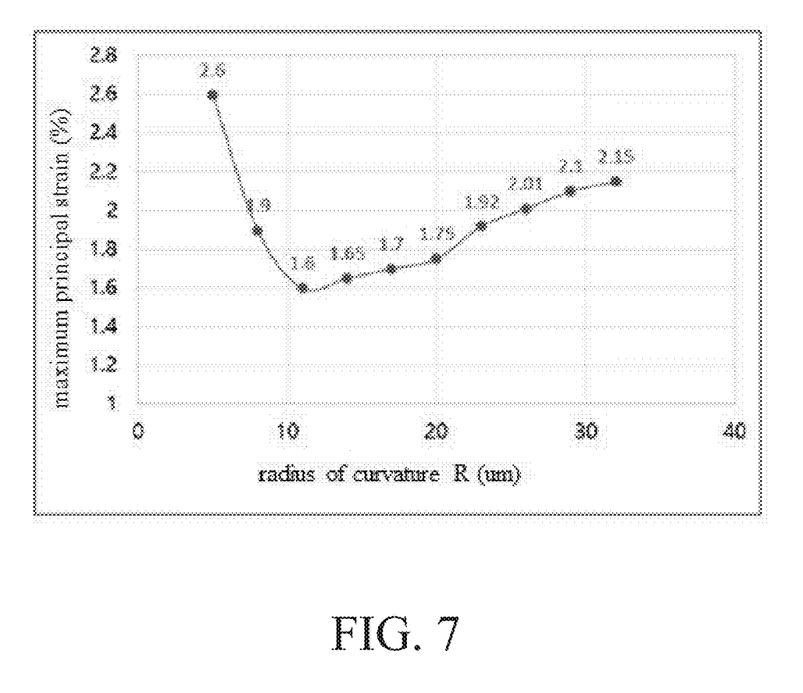
FIG. 7 is a graph showing a maximum principal strain of the first connection part changing with a radius of curvature thereof according to an embodiment of the present disclosure.
Figure 8:
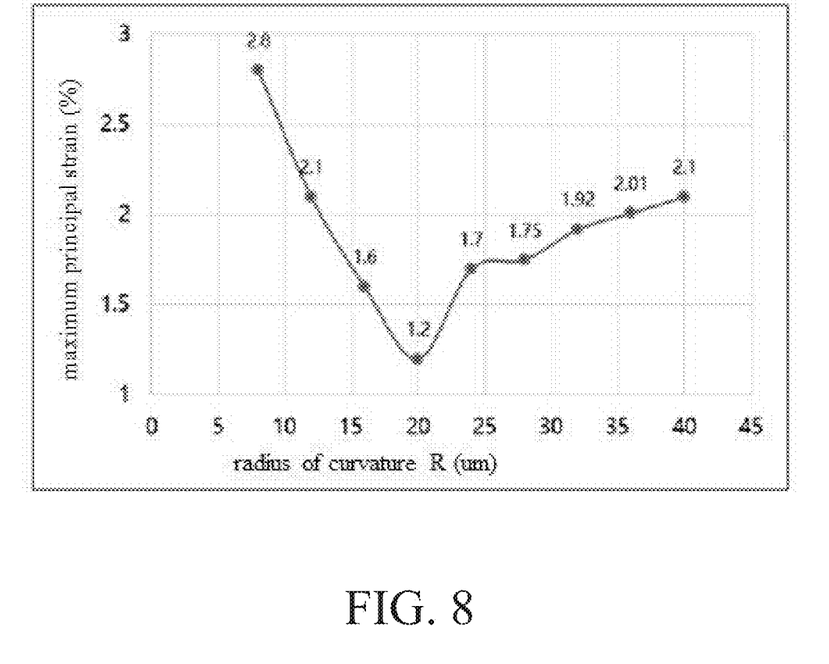
FIG. 8 is a graph showing a maximum principal strain of a first bending part changing with a radius of curvature thereof according to an embodiment of the present disclosure.

A maximum strain of the bridges 12 when stretching is mainly determined by the radius of curvature designed in each bending part. When the display area AA is stretched 5%, strains of the bending parts of each bridge 12 are higher, and a risk of breaking the bridges 12 is higher, thereby causing the display device layers where the pixel units 20 are located to be unable to be light up. Therefore, different values of R1 to R5 are calculated by a simulation calculation in this embodiment, and a reasonable range of the radius of curvature of each bending part can be obtained. Referring to FIGS. 7 and 8, FIG. 7 is a graph showing a maximum strain of the first connection part 121 changing with the radius of curvature thereof, and FIG. 8 is a graph showing a maximum strain of the first bending part 122 changing with the radius of curvature thereof. The abscissa is the radius of curvature R (um), and the ordinate is a maximum principal strain (%).

From FIG. 7, it can be seen that when the radius of curvature R4 of the first connection part 121 ranges from 5 to 32 μm, the maximum strain of the first connection part 121 reduces and then increases with an increase of the radius of curvature R4 thereof. The radius of curvature R4 preferably ranges from 10 to 20 μm, and a maximum strain corresponding to this range is not greater than 1.75%. In this embodiment, the radius of curvature R4 of the first connection part 121 and the radius of curvature R5 of the external chamfer 1211 are preferably 12 μm, and at this time, the maximum principal strain received by the first connection part 121 is at its lowest value, which is 1.6%.

From FIG. 8, it can be seen that when the radius of curvature R1 of the first bending part 122 ranges from 8 to 40 μm, the maximum strain of the first bending part 122 reduces and then increases with an increase of the radius of curvature R1 thereof. The radius of curvature R1 preferably ranges from 15 to 25 μm, and a maximum strain corresponding to this range is not greater than 1.75%. In this embodiment, the radius of curvature R1 of the first bending part 122, the radius of curvature R2 of the second bending part 123, and the radius of curvature R3 of the third bending part 124 are preferably 20 μm, and at this time, the maximum principal strain received by each bending part is at its lowest value, which is 1.2%.

Figure 9:
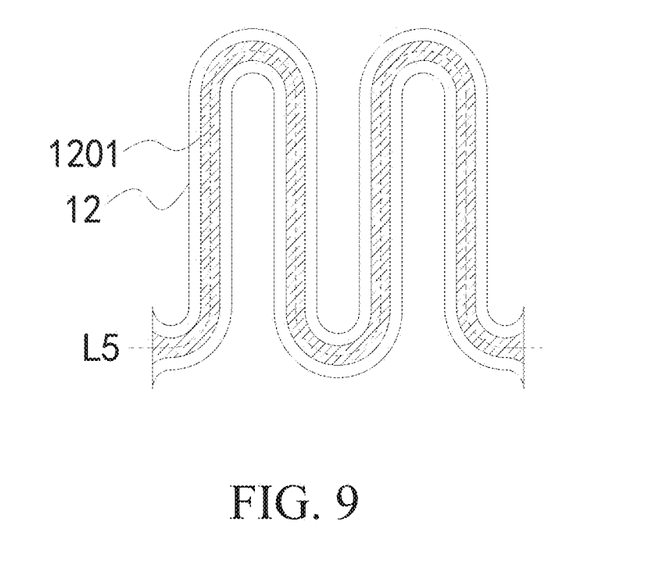
FIG. 9 is a schematic structural diagram of a wiring placement area according to an embodiment of the present disclosure.

In an embodiment of the present disclosure, referring to FIG. 9, each of the bridges 12 includes a wiring placement area 1201 having a same extending direction as the bridges 12, and the wirings 30 are disposed in the wiring placement area 1201. The wiring placement area 1201 corresponds to a part in each bridge 12 receiving a smaller stress when bending, so the wiring placement area 1201 can be understood as a safe wiring placement area.

Figure 10:
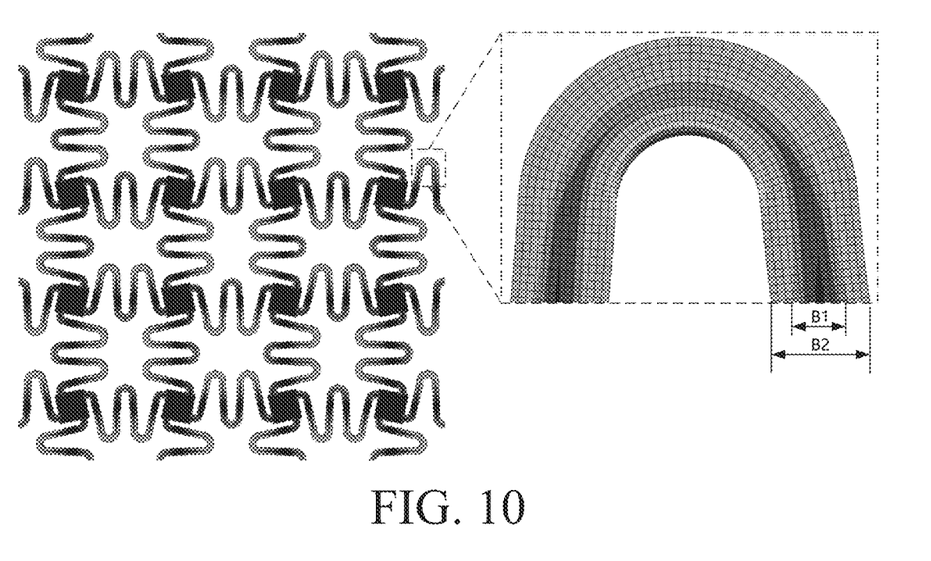
FIG. 10 shows a stretching deformation simulation cloud diagram of a display area AA and a schematic partial enlarged diagram of a bending part according to an embodiment of the present disclosure.

Referring to FIG. 10, FIG. 10 shows a stretching deformation simulation cloud diagram of the display area AA and a schematic partial enlarged diagram of the bending parts, and a darker site denotes a smaller elastic deformation corresponding thereof. From FIG. 10, it can be seen that the islands and the straight parts have smaller elastic deformations, two sides of the bending parts have larger elastic deformations, and elastic deformations on a central position of the bending parts are relatively smaller than the elastic deformations on the two sides of the bending parts.

Therefore, the wiring placement area 1201 may be disposed on the central position of each bridge 12, that is, a central line of the wiring placement area 1201 may be coincide with a central line L5 of each bridge 12, and the central lines refer to lines extending along a length direction.

Specifically, a ratio of a width of the wiring placement area 1201 to a width of a main body of each bridge may be designed to range from ½ to ¾. In this range, the wirings in the wiring placement area 1201 may have a least stretching deformation, thereby reducing a risk of breaking the wirings.

Therefore, when setting the wirings, the wirings are designed to be as close as possible to the central line L5 of the bending parts, which has a smaller stress.

After determining preferred values of the radii of curvature R1 to R5 of the bridges 12, the width of the wiring placement area 1201 can be determined by the simulation calculation. In this embodiment, the width B1 of the wiring placement area 1201 may be 20 μm, and a width B2 of the bending parts may be 28 μm.

The stretchable display module 100 in this embodiment can be freely stretched in any direction, light-emitting device layers can display normally in a state of a tensile elongation not less than 5%, and can realize the pixel density not less than 70.5 PPI. Meanwhile, the light-emitting device layers will not be damaged after the stretchable display module is repeatedly stretched. Under the characteristics of this indicator, when screens are stretched at a strain of not less than 5%, display brightness of the display module basically remains unchanged, resistances in a wiring layer among the islands do not have significant changes, and the screens can freely restore to their original states.

Figure 11:
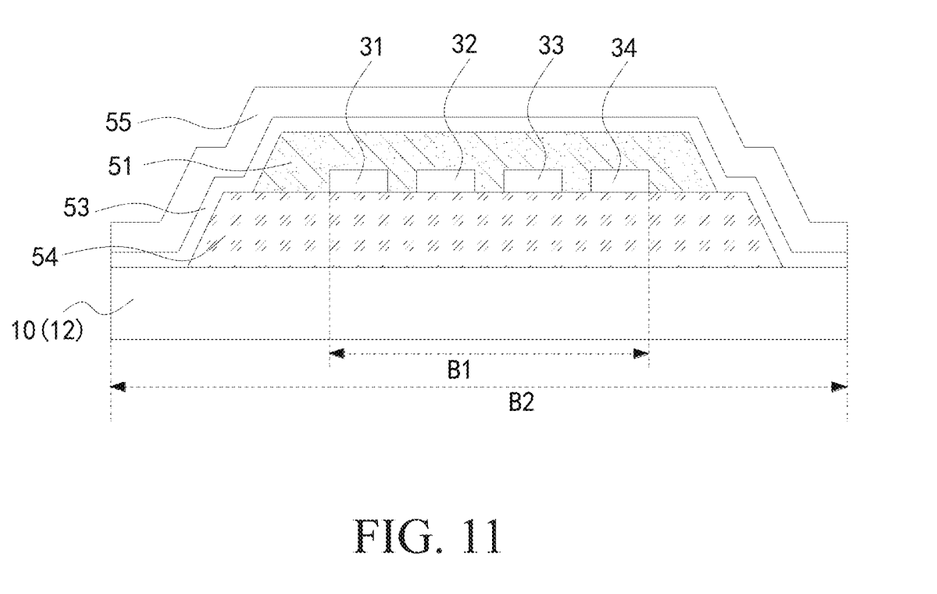
FIG. 11 is a schematic cross-sectional diagram of A-A' in FIG. 4 according to an embodiment of the present disclosure.

Referring to FIGS. 4 and 11, FIG. 11 is a schematic cross-sectional diagram of A-A' in FIG. 4. The wiring placement area of each bridge 12 is provided with a plurality of wirings 31, 32, 33, and 34 spaced apart to each other. A number of the wirings may be determined according to actual designs, and is not limited herein.

Figure 12:
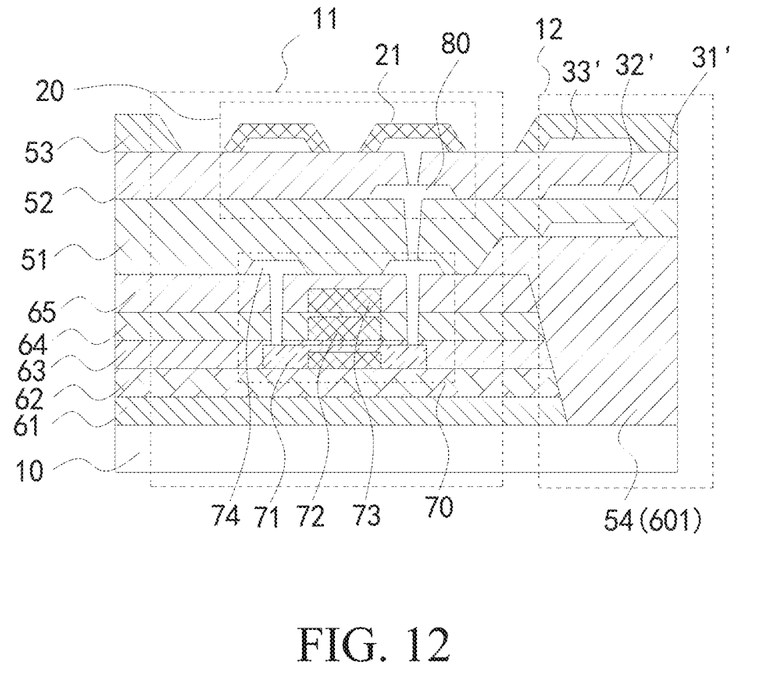
FIG. 12 is a schematic structural diagram of film layers stacked on the island and the bridge according to another embodiment of the present disclosure.

Specifically, FIG. 11 shows a schematic film layer stacking diagram of an area where the bridges are located in an embodiment, and FIG. 12 shows another schematic film layer stacking diagram of the area where the bridges are located in another embodiment. The stretchable display module 100 includes the flexible substrate 10 and a plurality of inorganic layers and organic layers stacked on the flexible substrate 10, and the hollowed-out parts 13 penetrate through the inorganic layers, the organic layers, and the flexible substrate 10.

A driving layer 70 is disposed on the islands 11, the pixel units 20 are disposed on the driving layer 70, and the pixel units 20 are electrically connected to the driving layer 70.

Specifically, the driving layer 70 includes a thin film transistor array, and each thin film transistor includes an active layer 71, a first gate electrode 72, a second gate electrode 73, and a source and drain electrode layer 74.

Each of the pixel units 20 includes an anode 21, a light-emitting layer, and a cathode (not shown in the figure), and the anode 21 is electrically connected to the source and drain electrode layer 74 by a through-hole.

Wherein, in an area where the islands 11 are located, adjacent film layers between the active layer 71, the first gate electrode 72, the second gate electrode 73, the source and drain electrode layer 74, and the anode 21 are insulated from each other by the inorganic layers or the organic layers.

Specifically, the area where the islands 11 are located includes a first barrier layer 61, a second barrier layer 62, a first gate insulating layer 63, a second gate insulating layer 64, an interlayer dielectric layer 65, a first planarization layer 51, a second planarization layer 52, and a pixel definition layer 53 stacked on the flexible substrate 10 in sequence.

In an embodiment, referring to FIG. 12, the area where the bridges 12 are located includes an organic filling layer 54, the first planarization layer 51, the second planarization layer 52, and the pixel definition layer 53 stacked on the flexible substrate 10 in sequence.

Wherein, the first barrier layer 61, the second barrier layer 62, the first gate insulating layer 63, the second gate insulating layer 64, and the interlayer dielectric layer 65 may be the inorganic layers.

The organic filling layer 54, the first planarization layer 51, the second planarization layer 52, and the pixel definition layer 53 may be the organic layers.

Compared to the film layers stacked on the islands 11, the inorganic layers between the wirings 30 on each of the bridges 12 and the flexible substrate 10 may be hollowed out to form a groove 601, and the groove 601 is filled with the organic filling layer 54.

In an embodiment, the wirings 30 may be a structure having a plurality of wiring layers, which may include a plurality of wirings having a same shape and different widths. The width of each bridge 12 connecting the adjacent islands 11 may be reduced by layered settings, thereby reducing rigidity of the island-bridge structure, and improving overall flexibility of the display module 100.

Referring to FIG. 12, three wiring layers in FIG. 12 are taken as an example for description, but it is not limited to this. Specifically, the wirings 30 include a first wiring layer 31', a second wiring layer 32', and a third wiring layer 33' stacked in sequence along a direction away from the flexible substrate 10.

The first wiring layer 31' is disposed on the organic filling layer 54, the second wiring layer 32' is disposed on the first planarization layer 51, and the third wiring layer 33' is disposed on the second planarization layer 52.

The first wiring layer 31' may be disposed on a same layer as the source and drain electrode layer 74, a bridging layer 80 may be disposed between the anode 21 and the source and drain electrode layer, and the anode 21 is connected to the source and drain electrode layer 74 by the bridging layer 80. The second wiring layer 32' may be disposed on a same layer as the bridging layer 80, and the third wiring layer 33' may be disposed on a same layer as the anode 21 of each of the pixel units 20.

Referring to FIG. 11, in another embodiment, the wirings 31, 32, 33, and 34 may also be a single layered structural design, that is, the wirings are disposed in a same layer. The wirings may be disposed on a same layer as the source and drain electrode layer 74 of the driving layer 70. In other embodiment, the wirings 30 may be disposed on a same layer as other metal device in the driving layer 70 and the pixel units 20.

Referring to FIG. 11, the area where the bridges 12 are located includes the organic filling layer 54, the first planarization layer 51, the pixel definition layer 53, and a supportive layer 55 stacked on the flexible substrate 10.

A material of the inorganic layers includes inorganic insulating materials, such as silicon nitride and silicon oxide, to have insulation and isolate water and oxygen.

The organic layers may include organic insulating materials, such as polyimide compounds and polyacrylamide compounds, which can prevent oxygen and water vapor from penetrating into an interior of each functional layer, and can also improve flexibility of the bridges 12 when stretched.

Both the organic layers and the inorganic layers can be formed by chemical vapor deposition.

A thickness of the flexible substrate 10 may range from 5 to 7 μm, and the thickness of the flexible substrate 10 in this embodiment is preferably 6 μm.

A tensile modulus of the flexible substrate 10 ranges from 2.9 to 3.1 GPa, and the tensile modulus of the flexible substrate 10 in this embodiment is preferably 3 GPa.

The flexible substrate 10 may include polyimide material, but it is not limited to this.

The flexible substrate 10 is formed by exposure, development, and etching, and the flexible substrate 10 uses a grid design and removes continuity of a material thereof, which can effectively reduce the tensile modulus thereof, thereby allowing the substrate where the pixel units are located to have good stretchability and retractability. Island structures are connected to each other by bending wiring structures, so stretches and deformations of the bending wirings connected between the island structures when stretched can prevent the island structures from being direct stretched and damaged, which causes breakage and loss of effectiveness.

The wirings 30 in this embodiment may be titanium aluminum alloy material, and may also be other conductive materials.

The stretchable display module 100 provided in the present disclosure can be applied to stretchable display devices, such as organic light-emitting diode (OLED) display devices, foldable display devices, rollable display devices, large-screen display devices, and expandable display devices. The stretchable display module 100 in the present disclosure can be applied to display fields such as vehicle displays, flexible wearable displays, and flexible medical displays.

The stretchable display module having island-bridge structures provided by the present disclosure, when stretching by an external force, can ensure each island to deform simultaneously during stretching and to undergo uniform forces, and ensure each bridge to undergo relatively balanced forces everywhere during stretching, thereby relieving and dispersing stresses and preventing local stress concentration. Therefore, breakage of the stretchable units can be prevented, and high-resolution display having a pixel density not less than 70.5 PPI can be realized.

The stretchable display module provided by the embodiments of the present disclosure are described in detail above. Specific examples are used herein to explain the principles and implementation of the present disclosure. The descriptions of the above embodiments are only used to help understand the method of the present disclosure and its core ideas; meanwhile, for those skilled in the art, the range of specific implementation and application may be changed according to the ideas of the present disclosure. In summary, the content of the specification should not be construed as causing limitations to the present disclosure.

What is claimed is:

1. A stretchable display module, comprising:
a plurality of islands distributed in an array, wherein each of the islands is provided with at least one pixel unit; and
a plurality of bridges, wherein each of the bridges connects two adjacent islands and is provided with a plurality of wirings, and each of the bridges comprises a first connection part, a second connection part, and a plurality of bending parts disposed between the first connection part and the second connection part and connected to each other in sequence, the first connection part is connected to a first side of one of the islands, and the second connection part is connected to a second side of another one of the adjacent islands;
the first side comprises a first endpoint and a second endpoint, and the second side comprises a third endpoint on a same side as the first endpoint and a fourth endpoint on a same side as the second endpoint, wherein a distance between the first endpoint and the first connection part is less than a distance between the second endpoint and the first connection part, and a distance between the third endpoint and the second connection part is less than a distance between the fourth endpoint and the second connection part; and wherein the bending parts do not protrude from a connecting line between the first endpoint and the third endpoint;

wherein each of the bridges has a first bending direction and a second bending direction with different bending directions to each other, a plurality of the bending parts having the first bending direction do not protrude from the connecting line between the first endpoint and the third endpoint, and a plurality of the bending parts having the second bending direction protrude from a connecting line between the second endpoint and the fourth endpoint.

2. The stretchable display module according to claim 1, wherein each of the bridges further comprises:

a first bending part connected to the first connection part;

a second bending part connected to the first bending part; and a third bending part connected to the second bending part and the second connection part.

3. The stretchable display module according to claim 2, wherein the second bending part does not protrude from the connecting line between the first endpoint and the third endpoint, and the first bending part and the third bending part protrude from the connecting line between the second endpoint and the fourth endpoint.

4. The stretchable display module according to claim 3, wherein an outer edge of the second bending part is positioned in an area formed between the connecting line between the first endpoint and the third endpoint and a connecting line between a midpoint of the first side and a midpoint of the second side.

5. The stretchable display module according to claim 3, wherein each of the bridges is an axisymmetric structure, and a symmetry axis of each of the bridges coincides with a symmetry axis of the two adjacent islands connected to each of the bridges.

6. The stretchable display module according to claim 5, wherein each of the bridges further comprises a plurality of straight parts, and each of the straight parts connects two adjacent bending parts to each other or connects one bending part to one connection part adjacent to each other.

7. The stretchable display module according to claim 6, wherein each of the bridges comprises a first straight part connecting the first connection part to the first bending part and a second straight part connecting the first bending part to the second bending part, and a length of the first straight part is same as a length of the second straight part.

8. The stretchable display module according to claim 7, wherein the first straight part is parallel to the second straight part.

9. The stretchable display module according to claim 8, wherein a width of the first straight part is same as a width of the second straight part.

10. The stretchable display module according to claim 5, wherein a radius of curvature of the first bending part is same as a radius of curvature of the second bending part.

11. The stretchable display module according to claim 5, wherein the first connection part and the second connection part both comprise another bending part.

12. The stretchable display module according to claim 11, wherein a radius of curvature of the bending part of the first connection part is different from a radius of curvature of the first bending part.

13. The stretchable display module according to claim 11, wherein a center of the bending part of the first connection part, a center of the second bending part, and a center of the bending part of the second connection part are on a same straight line.

14. The stretchable display module according to claim 1, wherein each of the islands comprises a plurality of sides, each of the sides is correspondingly connected to one of the bridges, and a plurality of the bridges connected to a same island has a centrosymmetric structure that is symmetrical about a center of the island.

15. The stretchable display module according to claim 1, wherein each of the bridges comprises a wiring placement area having a same extending direction as the bridges, and the wirings are disposed in the wiring placement area.

16. The stretchable display module according to claim 15, wherein a ratio of a width of the wiring placement area to a width of a main body of the bridges ranges from 1/2 to 3/4.

17. The stretchable display module according to claim 1, comprising a flexible substrate, the plurality of islands, the plurality of bridges, and a plurality of hollowed-out parts.

18. The stretchable display module according to claim 17, further comprising a plurality of inorganic layers and organic layers stacked on the flexible substrate, and the hollowed-out parts penetrate through the inorganic layers, the organic layers, and the flexible substrate.

19. The stretchable display module according to claim 1, wherein each of the islands is provided with one pixel unit, and the pixel unit comprises three sub-pixels having different colors.

* * * * *